United States Patent
Chuang

(10) Patent No.: US 11,888,511 B2
(45) Date of Patent: Jan. 30, 2024

(54) COMMUNICATION DEVICE AND RADIO FREQUENCY CIRCUIT

(71) Applicant: WISTRON NEWEB CORPORATION, Hsinchu (TW)

(72) Inventor: Fu-Chi Chuang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 45 days.

(21) Appl. No.: 17/718,417

(22) Filed: Apr. 12, 2022

(65) Prior Publication Data

US 2023/0155623 A1    May 18, 2023

(30) Foreign Application Priority Data

Nov. 17, 2021   (TW) .................................. 110142700

(51) Int. Cl.
*H04B 1/48*         (2006.01)
*H05K 1/02*         (2006.01)

(52) U.S. Cl.
CPC .............. *H04B 1/48* (2013.01); *H05K 1/0243* (2013.01)

(58) Field of Classification Search
CPC ................................ H05K 1/0243; H04B 1/48
See application file for complete search history.

(56) References Cited

U.S. PATENT DOCUMENTS

| | | | | |
|---|---|---|---|---|
| 5,212,815 A  * | 5/1993 | Schumacher | ........... | H01P 5/185 333/204 |
| 6,392,503 B1 * | 5/2002 | Thornton | ................ | H01P 5/185 333/116 |
| 7,532,088 B2 * | 5/2009 | Boulet, Jr. | .............. | H01P 5/185 333/116 |
| 7,880,560 B2 * | 2/2011 | He | ............................ | H01P 5/18 333/123 |
| 8,941,536 B2 * | 1/2015 | White | ................... | G01S 13/536 342/194 |
| 9,318,788 B2 * | 4/2016 | Spokoinyi | ............... | H01P 11/00 |
| 9,634,697 B2 | 4/2017 | Natesan et al. | | |
| 11,284,513 B2 * | 3/2022 | Yoo | ........................ | H05K 1/115 |
| 2009/0128255 A1* | 5/2009 | Dupont | ..................... | H01P 5/18 333/109 |
| 2010/0096667 A1* | 4/2010 | Nakajima | ........... | H01L 29/7783 257/256 |
| 2019/0097606 A1* | 3/2019 | Nosaka | ................ | H03H 9/6406 |

FOREIGN PATENT DOCUMENTS

TW         201711406 A       3/2017

* cited by examiner

*Primary Examiner* — Hoa C Nguyen
*Assistant Examiner* — Amol H Patel
(74) *Attorney, Agent, or Firm* — McClure, Qualey & Rodack, LLP

(57) ABSTRACT

A communication device and a radio frequency circuit are provided. The communication device includes an antenna element, a transceiver, and the radio frequency circuit. The radio frequency circuit includes a substrate, a first conducting wire, a second conducting wire, and four transmission lines. The four transmission lines are respectively connected to two ends of the first conducting wire and two ends of the second conducting wire to form an input part, an output part, a coupling part, and an isolation part, respectively. The first conducting wire and the second conducting wire are separate from each other and coupled to each other, and each of a width of the first conducting wire and a width of the second conducting wire is not equal to a width of any one of the four transmission lines.

16 Claims, 13 Drawing Sheets

COMMUNICATION DEVICE AND RADIO FREQUENCY CIRCUIT

CROSS-REFERENCE TO RELATED PATENT APPLICATION

This application claims the benefit of priority to Taiwan Patent Application No. 110142700, filed on Nov. 17, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a device and a circuit for transmitting radio frequency signals, and more particularly to a communication device and a radio frequency circuit that have coupling and filtering functions.

BACKGROUND OF THE DISCLOSURE

In recent years, wireless networks are widely used in public places or at home. For example, radio frequencies are used for mobile phones, automobiles, Internet of things devices, etc. Therefore, the use of radio frequency circuits in electronic systems has been increased significantly. In this case, a way of monitoring radio frequency levels while not incurring losses in transmission lines and load is needed.

In conventional communication devices, couplers are usually inserted in the transmission line, thereby achieving precise monitoring of radio frequency energy flow in the transmission line while avoiding losses in the transmission line and the load. The coupler introduces minimal disturbances to a main line signal. In addition, the coupler can differentiate between forward power and reflected power, and be used for monitoring a return loss or a standing wave ratio, thereby providing feedback of load changes when signals are transmitted. However, the conventional technology described above still has room for improvement.

SUMMARY OF THE DISCLOSURE

In response to the above-referenced technical inadequacy, the present disclosure provides a communication device and a radio frequency circuit.

In one aspect, the present disclosure provides a communication device, for operating in an operating frequency band. The communication device includes an antenna element, a transceiver, and a radio frequency circuit. The transceiver is electrically connected to the antenna element, and the transceiver has a transmitting end and a feedback receiving end. The radio frequency circuit is electrically connected between the antenna element and the transceiver. The radio frequency circuit includes a substrate, a first conducting wire, a second conducting wire, and four transmission lines. The first conducting wire is disposed on a first surface of the substrate. The second conducting wire is disposed on the first surface, and the second conducting wire is arranged corresponding to the first conducting wire. Two of the four transmission lines are respectively connected to two ends of the first conducting wire to form an input part and an output part, respectively, and another two of the four transmission lines are respectively connected to two ends of the second conducting wire to form a coupling part and an isolation part, respectively. The input part is arranged corresponding to the coupling part, and the output part is arranged corresponding to the isolation part. The input part is electrically connected to the transmitting end, the output part is electrically connected to the antenna element, the coupling part is electrically connected to the feedback receiving end, and the isolation part is connected to a ground potential. The first conducting wire and the second conducting wire are separate from each other and coupled to each other, and each of a width of the first conducting wire and a width of the second conducting wire is not equal to a width of any one of the four transmission lines.

In another aspect, the present disclosure provides a radio frequency circuit, which includes a substrate, a first conducting wire, a second conducting wire, and four transmission lines. The first conducting wire is disposed on a first surface of the substrate. The second conducting wire is disposed on the first surface, and the second conducting wire is arranged corresponding to the first conducting wire. Two of the four transmission lines are respectively connected to two ends of the first conducting wire to form an input part and an output part, respectively, and another two of the four transmission lines are respectively connected to two ends of the second conducting wire to form a coupling part and an isolation part, respectively. The input part is arranged corresponding to the coupling part, and the output part is arranged corresponding to the isolation part. The input part is electrically connected to the transmitting end, the output part is electrically connected to the antenna element, the coupling part is electrically connected to the feedback receiving end, and the isolation part is connected to a ground potential. The first conducting wire and the second conducting wire are separate from each other and coupled to each other, and each of a width of the first conducting wire and a width of the second conducting wire is not equal to a width of any one of the four transmission lines.

Therefore, one of the beneficial effects of the present disclosure is that, in the communication device and the radio frequency circuit provided by the present disclosure, by virtue of "the first conducting wire and the second conducting wire being separate from each other and coupled to each other, and each of the width of the first conducting wire and the width of the second conducting wire being not equal to the width of any one of the four transmission lines," each of the first conducting wire and the second conducting wire has characteristics of both capacitance and inductance, so that the radio frequency circuit provided by the present disclosure can have both coupling and filtering effects.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
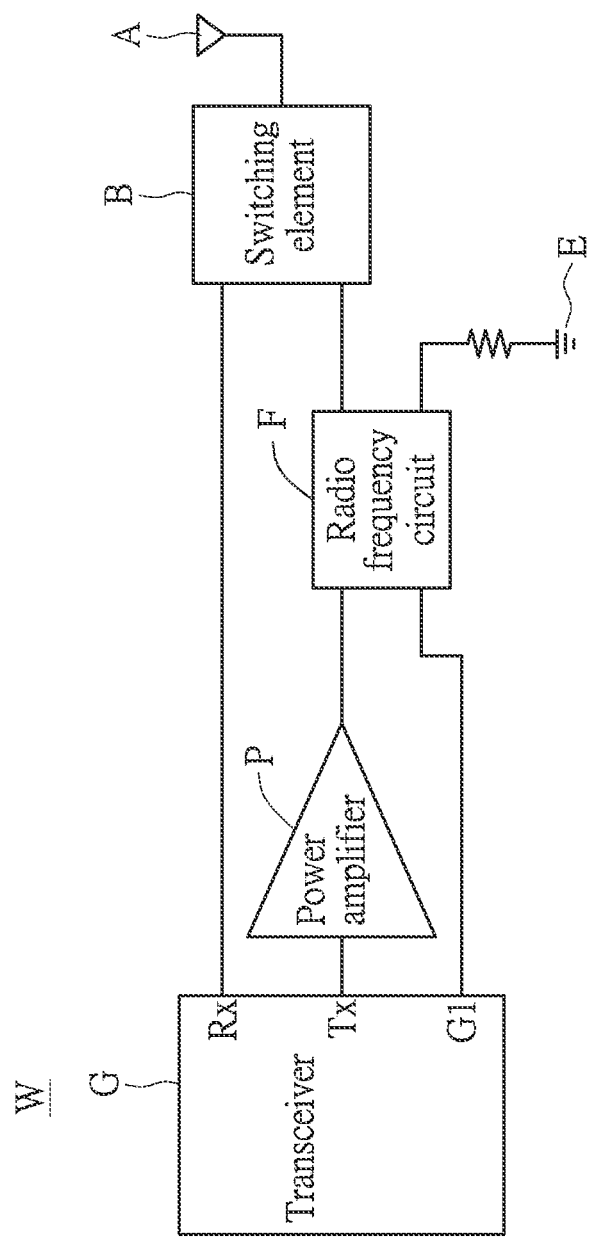
FIG. 1 is a functional block diagram of a communication device according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like. In addition, the term "connect" can be used to describe a physical connection directly or indirectly between two components, and the term "couple" can be used to describe a separation between two components without any physical connections, which an electrical field energy generated by a current from one component excites an electrical field energy of another component.

Embodiments

Referring to FIG. 1, FIG. 1 is a functional block diagram of a communication device of the present disclosure. The present disclosure provides a communication device W for operating in an operating frequency band. The communication device W includes an antenna element A, a transceiver G, a radio frequency circuit F, and a power amplifier P. The transceiver G can be, for example, a radio frequency chipset, and is electrically connected to the antenna element A. The transceiver G has a transmitting end Tx, a receiver Rx, and a feedback receiving end G1. The radio frequency circuit F is electrically connected between the antenna element A and the transceiver G. The power amplifier P is electrically connected between the transceiver G and the radio frequency circuit F. Further, the communication device W also includes a switching element B. The switching element B can be, for example, a radio frequency switch, and is electrically connected between the receiver Rx of the transceiver G and the antenna element A. For example, in the embodiments of the present disclosure, a frequency range of the operating frequency band can be from 2.4 GHz to 2.5 GHz to produce corresponding signal transmission and reception effects. However, it should be noted that, the present disclosure is not limited by the frequency range of the operating frequency band of the communication device W. In other embodiments, the communication device W can also be used for other operating frequencies, such as an operating frequency of Wi-Fi® (i.e., a frequency range approximately from 5.15 GHz to 5.58 GHz).

Figure 2:
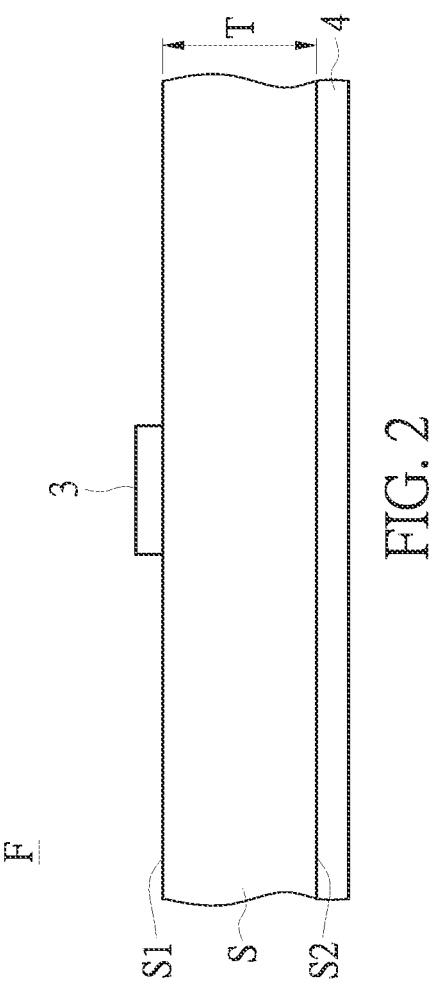
FIG. 2 is a schematic side view of a radio frequency circuit according to the present disclosure.
Figure 3:
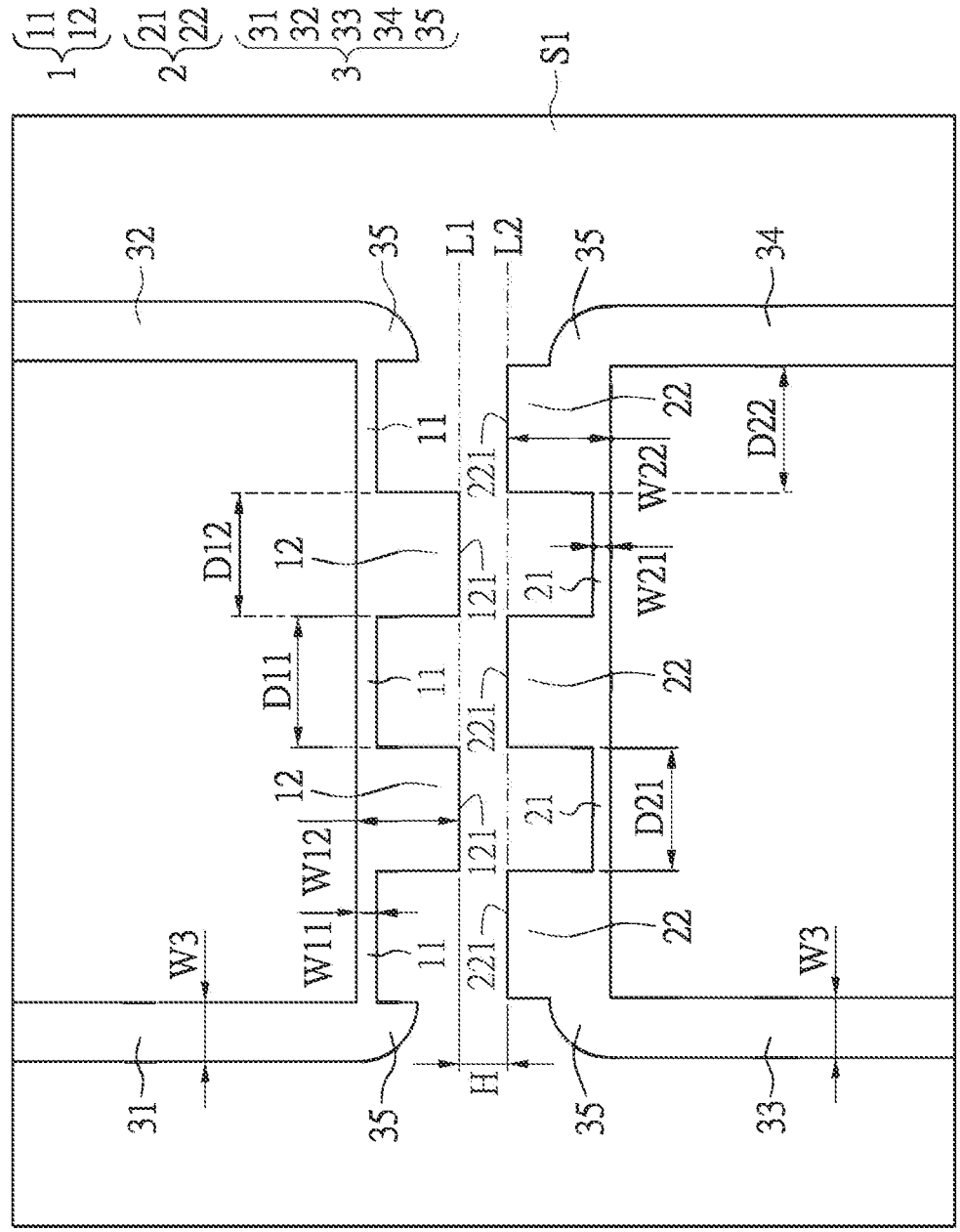
FIG. 3 is a schematic top view of a radio frequency circuit according to a first embodiment of the present disclosure.
Figure 4:
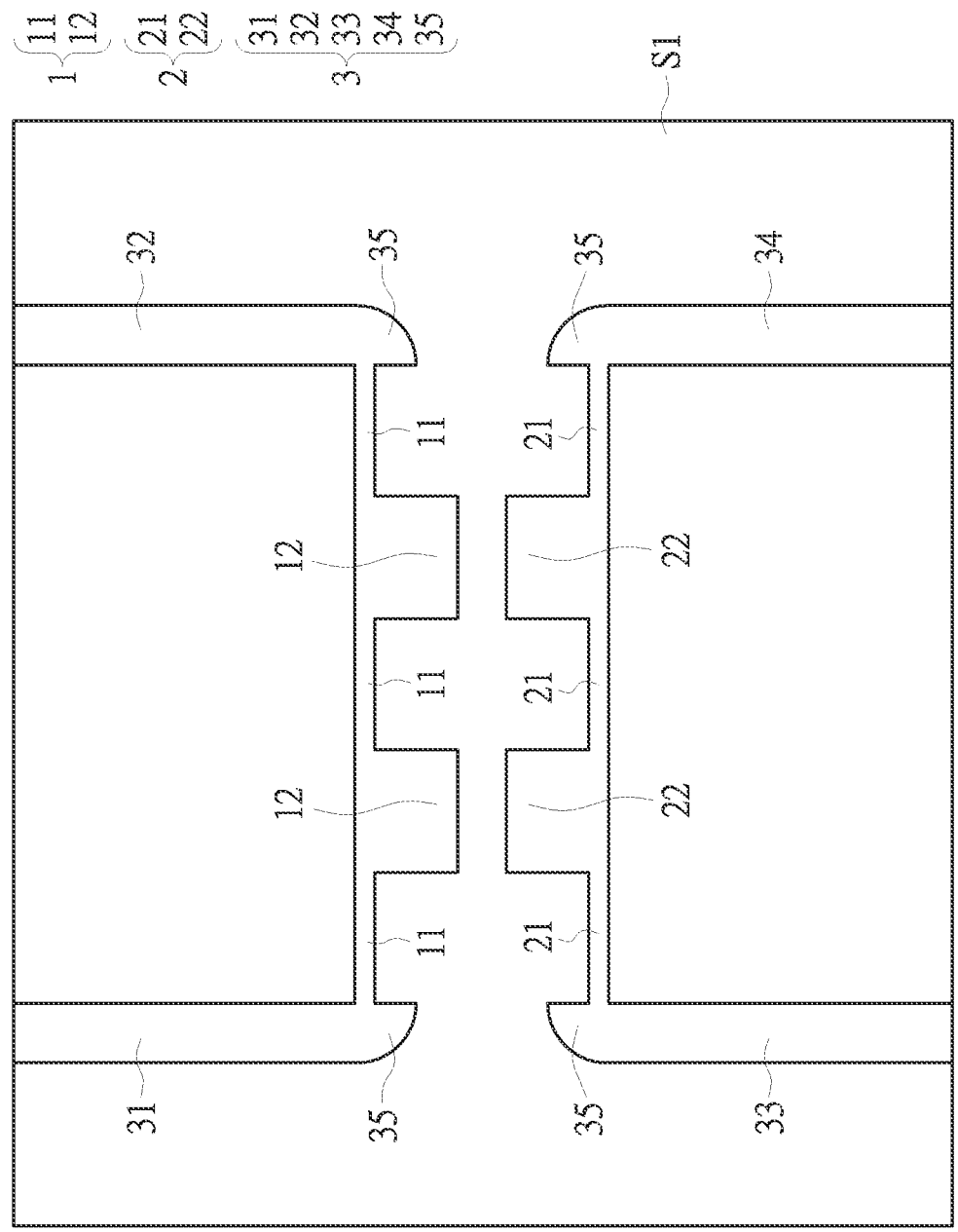
FIG. 4 is a schematic top view of a radio frequency circuit according to a second embodiment of the present disclosure.
Figure 5:
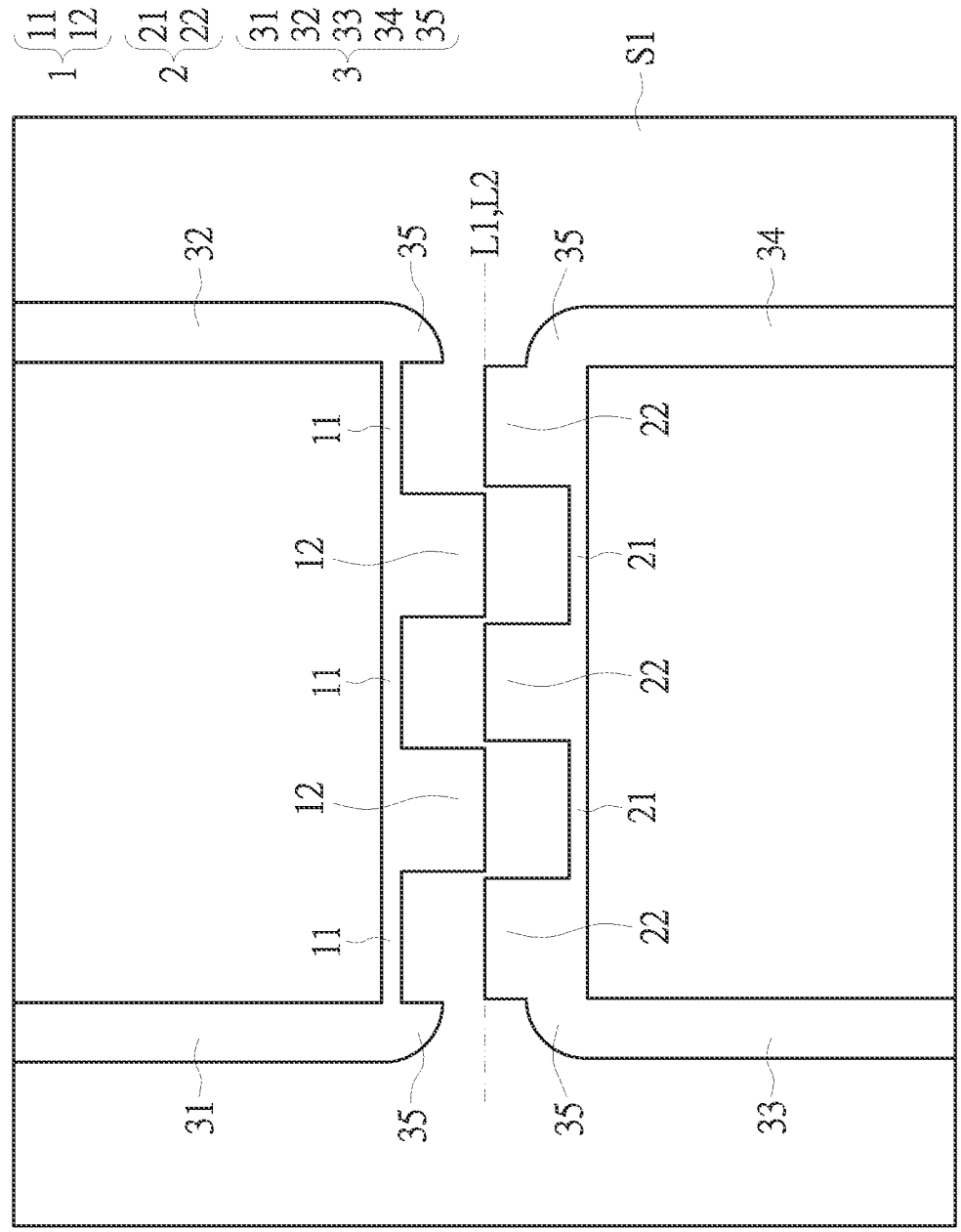
FIG. 5 is a schematic top view of a radio frequency circuit according to a third embodiment of the present disclosure.
Figure 6:
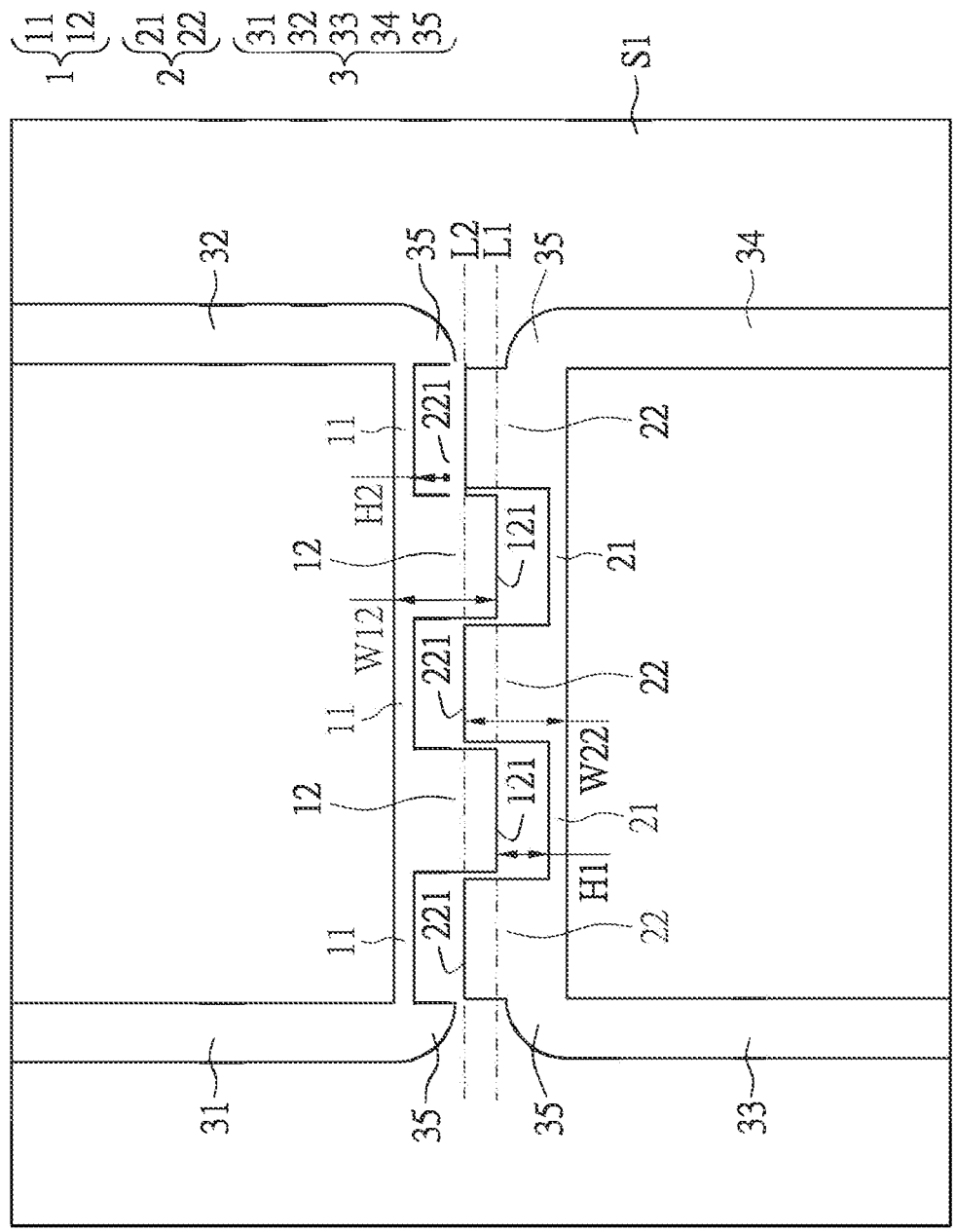
FIG. 6 is a schematic top view of a radio frequency circuit according to a fourth embodiment of the present disclosure.

Referring to FIG. 2 and FIG. 3, FIG. 2 is a schematic side view of the radio frequency circuit of the present disclosure, and FIG. 3 is a schematic top view of a radio frequency circuit according to a first embodiment of the present disclosure. The radio frequency circuit F includes a substrate S, a first conducting wire 1, a second conducting wire 2, and four transmission lines 3. The first conducting wire 1, the second conducting wire 2, and the four transmission lines 3 are correspondingly disposed on a first surface S1 of the substrate S (only the transmission line 3 disposed on the first surface S1 is exemplarily shown in FIG. 2). The first conducting wire 1 and the second conducting wire 2 are arranged corresponding to each other. The first conducting wire 1 and the second conducting wire 2 are separate from each other and coupled to each other. Moreover, the radio frequency circuit F can further include a metal layer 4. The metal layer 4 is disposed on a second surface S2 of the substrate S, and the second surface S2 is opposite to the first surface S1. For example, a printed circuit board (PCB) can be a base of the radio frequency circuit F of the present disclosure, a printed circuit structure is formed by arranging microstrips (i.e., the first conducting wire 1 and the second conducting wire 2) made of one metal copper foil and a characteristic impedance transmission line (i.e, the transmission line 3) on an upper surface (i.e., the first surface S1) of the PCB, and a layer of another metal copper foil is disposed on a lower surface (i.e., the second surface S2). The one metal copper foil on the upper surface correspondingly forms the first conducting wire 1, the second conducting wire 2 and the four transmission lines 3, and the another metal copper foil on the lower surface is the metal layer 4. However, the present disclosure is not limited in terms of the way that the radio frequency circuit F is formed.

Referring to FIG. 1 and FIG. 3, two of the four transmission lines 3 are respectively connected to two ends of the first conducting wire 1 to form an input part 31 and an output part 32, respectively, and another two of the four transmission lines 3 are respectively connected to two ends of the second conducting wire 2 to form a coupling part 33 and an isolation part 34, respectively. The input part 31 is arranged corresponding to the coupling part 33, and the output part 32 is arranged corresponding to the isolation part 34. The input part 31 is electrically connected to the transmitting end Tx of the transceiver G, and the output part 32 is electrically connected to the antenna element A. The coupling part 33 is electrically connected to the feedback receiving end G1 of the transceiver G, and the isolation part 34 is connected to a ground potential E. Therefore, when the transceiver G transmits a signal from the transmitting end Tx, the signal can be amplified by the power amplifier P and then transmitted to the switching element B and the antenna element A through the first conducting wire 1 of the radio frequency circuit F, and then transmitted to an outside. When the signal passes through the first conducting wire 1, energy of the signal can be transmitted to the second conducting wire 2 through the coupling of the first conducting wire 1 and the second conducting wire 2, so that the second conducting wire 2 can transmit a feedback signal to the feedback receiving end G1 of the transceiver G through the coupling part 33 of the second conducting wire 2. It should be noted that, each of a width of the first conducting wire 1 and a width of the second conducting wire 2 is not equal to a width W3 of any one of the four transmission lines 3.

Furthermore, for example, in the embodiments of the present disclosure, a thickness T of the substrate S is 0.8 mm, and the width W3 of each of the four transmission lines 3 is 1.5 mm, but the present disclosure is not limited thereto. Dimensions of the substrate S (such as a width and the thickness thereof) can vary based on a material of the substrate S, and the four transmission lines 3 can also be designed to have different impedance based on specifications of an end product (i.e., the communication device W). In addition, each of an impedance value of the first conducting wire 1 and an impedance value of the second conducting wire 2 can also vary based on specifications of the substrate S.

Referring to FIG. 3, each of the four transmission lines 3 has an adaption part 35 at one end of each of the four transmission lines 3 that is used to be connected to the first conducting wire 1 or the second conducting wire 2. According to the preceding paragraph, impedance of the microstrips (i.e., the first conducting wire 1 and the second conducting wire 2) can be different from the impedance of each of the four transmission lines 3, so that each of the four transmission lines 3 is correspondingly connected to the first conducting wire 1 or the second conducting wire 2 through the adaption part 35. Therefore, impedance matching between the microstrips and the transmission line 3 is achieved through the adaption part 35. The present disclosure is not limited to a shape of the adaption part 35, and the adaption part 35 can be arc-shaped, rectangular-shaped, or triangular-shaped. Preferably, an edge profile of the adaption part 35 is a quarter arc having a radius defined by the width W3 of the transmission line 3 (i.e., the shape of the adaption part 35 is a quarter circle), which enables a smooth impedance transition between the transmission line 3 and the first conducting wire 1 or the second conducting wire 2, so that less energy is lost in a process of signal transmission.

Furthermore, as shown in FIG. 3, the first conducting wire 1 has three first branches 11 and two second branches 12 that are staggered with each other, and the second conducting wire 2 has two third branches 21 and three fourth branches 22 that are staggered with each other. Each of a width W11 of each of the three first branches 11 and a width W21 of each of the two third branches 21 is less than the width W3 of any one of the four transmission lines 3, and each of a width W12 of each of the two second branches 12 and a width W22 of each of the three fourth branches 22 is greater than the width W3 of any one of the four transmission lines 3. When the first conducting wire 1 is arranged corresponding to the second conducting wire 2, the three first branches 11 of the first conducting wire 1 respectively correspond to the three fourth branches 22 of the second conducting wire 2, and the two second branches 12 of the first conducting wire 1 respectively correspond to the two third branches 21 of the second conducting wire 2. It should be noted that, the present disclosure is not limited to a quantity of each of the first branches 11, a second branches 12, the third branches 21, and the fourth branches 22.

According to the above, the three first branches 11 of the first conducting wire 1 have a first equivalent inductor, and the two second branches of the first conducting wire 1 have a first equivalent capacitor. An inductance value of the first equivalent inductor is proportional to a length D11 of the first branch 11 and inversely proportional to the width W11 of the first branch 11. A capacitance value of the first equivalent capacitor is proportional to an area of the second branch 12 (i.e., a length D12 of the second branch 12 multiplied by the width W12 of the second branch 12). In addition, each of the inductance value of the first equivalent inductor and the capacitance value of the first equivalent capacitor is inversely proportional to the thickness T of the substrate S. Similarly, the two third branches 21 of the second conducting wire 2 have a second equivalent inductor, and the three fourth branches 22 of the second conducting wire 2 have a second equivalent capacitor. An inductance value of the second equivalent inductor is proportional to a length D21 of the third branch 21 and inversely proportional to the width W21 of the third branch 21. A capacitance value of the second equivalent capacitor is proportional to an area of the fourth branch 22 (i.e., a length D22 of the fourth branch 22 multiplied by the width W22 of the fourth branch 22). Each of the inductance value of the second equivalent inductor and the capacitance value of the second equivalent capacitor is inversely proportional to the thickness T of the substrate S.

In this way, in the present disclosure, each of the width W11 of the first branch 11 of the first conducting wire 1 and the width W21 of the third branch 21 of the second conducting wire 2 is less than the width W3 of any one of the four transmission lines, so that the first branch 11 and the third branch 21 are able to have inductive properties. In addition, in the present disclosure, each of the width W12 of the second branch 12 of the first conducting wire 1 and the width W22 of the fourth branch 22 of the second conducting wire 2 is greater than the width W3 of any one of the four transmission lines 3, so that the first branch 11 and the third branch 21 are able to have capacitive properties. Accordingly, when the first conducting wire 1 and the second conducting wire 2 are coupled to each other and the energy is transmitted to the second conducting wire 2, a desired filtering effect (i.e., an unwanted frequency range is filtered out) can be achieved. Moreover, in the present disclosure, the length and the width of each of the first branch 11, the second branch 12, the third branch 21, and the fourth branch 22 can be adjusted to meet the different specifications required for the communication device W.

Referring to FIG. 3, a first edge L1 is defined by an extension of two sides 121 respectively of the two second branches 12 of the first conducting wire 1, a second edge L2 is defined by an extension of three sides 221 respectively of the three fourth branches 22 of the second conducting wire 2, and there is a distance between the first edge L1 and the second edge L2. The distance H is determined by a wavelength that corresponds to the operating frequency band and a dielectric coefficient of the substrate S. According to the above, when the operating frequency band of the embodiments of the present disclosure is from 2.4 GHz to 2.5 GHz, a minimum operating frequency of the operating frequency band can be achieved. In addition, a first wavelength λ1 can be obtained according to an initial wavelength of the minimum operating frequency in vacuum and the dielectric coefficient of the substrate S, which satisfies the following relation:

$$\lambda 1 = \lambda c / (\varepsilon_r)^{1/2},$$

where λc is the initial wavelength, and $\varepsilon_r$ is the dielectric coefficient of the substrate S.

Therefore, in the present disclosure, the distance H can range from 1/200 times to 1/4 times of the first wavelength λ1. Alternatively, the distance H can be from 0.3 mm to 17.1 mm, and preferably, the distance H is from 0.3 mm to 1.5 mm. In the present disclosure, through adjusting the distance H, a best coupling effect of the first conducting wire 1 and the second conducting wire 2 can be achieved.

Figure 10:
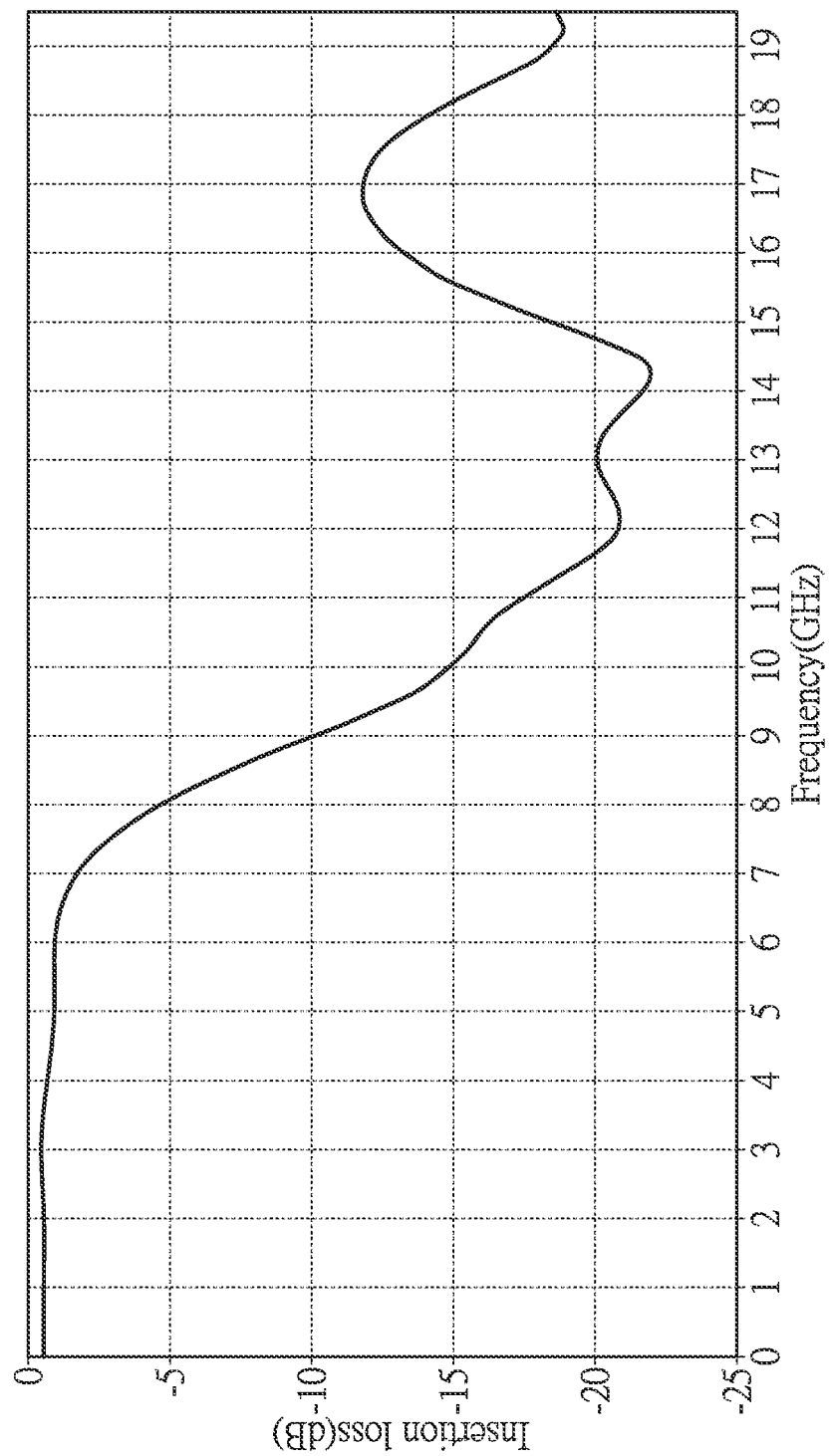
FIG. 10 is a curve diagram showing insertion losses of the radio frequency circuit according to the first embodiment of the present disclosure.
Figure 11:
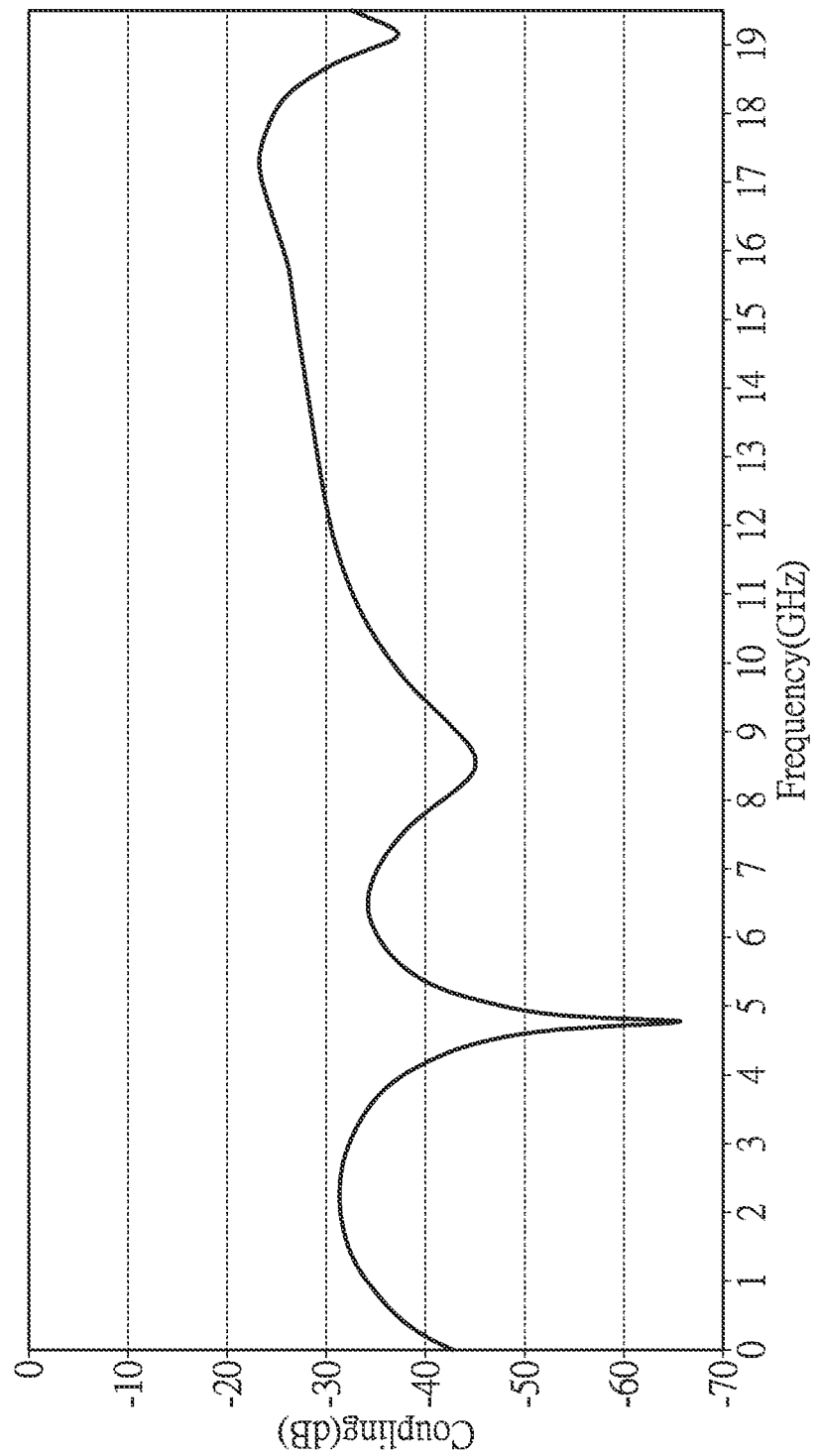
FIG. 11 is a curve diagram showing coupling of the radio frequency circuit according to the first embodiment of the present disclosure.

Referring to FIG. 10 and FIG. 11, FIG. 10 is a curve diagram showing insertion losses of the radio frequency circuit according to the first embodiment of the present disclosure, and FIG. 11 is a curve diagram showing coupling of the radio frequency circuit according to the first embodiment of the present disclosure. As shown in FIG. 10, through a structural design of the radio frequency circuit F of the present disclosure, the communication device W can have less insertion loss in the frequency range (i.e., 2.4 GHz to 2.5 GHz) of the operating frequency band, and have a better and flat coupling effect (as shown in FIG. 11, the coupling in the frequency range of 2.4 GHz to 2.5 GHz is close to −30 dB). That is, the feedback signal to transceiver G is more flat and stable for further calculation for the transceiver G.

It is worth mentioning that, the present disclosure is not limited to a configuration of each of the first conducting wire 1 and the second conducting wire 2. For example, referring to FIG. 4 to FIG. 7, FIG. 4 to FIG. 7 are schematic views of radio frequency circuits according to a second embodiment to a fifth embodiment of the present disclosure, respectively. Each of the radio frequency circuits of the second embodiment to the fifth embodiment has a structure similar to that of the radio frequency circuit of the first embodiment, and the similar structure is not reiterated herein. The main differences between the radio frequency circuits of the second embodiment to the fifth embodiment and the radio frequency circuits of the first embodiment are that, in the second embodiment (referring to FIG. 4), when the first conducting wire 1 is arranged corresponding to the second conducting wire 2, the first branch 11 corresponds to the third branch 21, and the second branch 12 corresponds to the fourth branch 22; in the third embodiment (referring to FIG. 5), the first edge L1 defined by the extension of the two sides 121 respectively of the two second branches 12 of the first conducting wire 1 and the second edge L2 defined by the extension of the three sides 221 respectively of the three fourth branches 22 of the second conducting wire 2 coincide with each other; in the fourth embodiment (referring to FIG. 6), a distance H1 between the first edge L1 defined by the extension of the two sides 121 respectively of the two second branches 12 of the first conducting wire 1 and the third branch 21 of the second conducting wire 2 is less than the width W22 of each of the three fourth branches 22 of the second conducting wire 2, and a distance H2 between the second edge L2 defined by the extension of the three sides 221 respectively of the three fourth branches 22 of the second conducting wire 2 and the first branch 11 is less than the width W12 of each of the two second branches 12. In addition, in the embodiments shown in FIG. 3 to FIG. 7, the second branch 12 of the first conducting wire 1 and the fourth branch 22 of the second conducting wire 2 extend in opposite directions, i.e., the second branch 12 extends in a direction toward the second conducting wire 2 and the fourth branch 22 extends in a direction toward the first conducting wire 1, but the present disclosure is not limited thereto. In other embodiments, the second branch 12 of the first conducting wire 1 and the fourth branch 22 of the second conducting wire 2 can also extend back to each other (not shown in the figures). Therefore, in the present disclosure, the coupling between the first conducting wire 1 and the second conducting wire 2 can be adjusted by changing the configurations of the first conducting wire 1 and the second conducting wire 2 to form different patterns.

Figure 7:
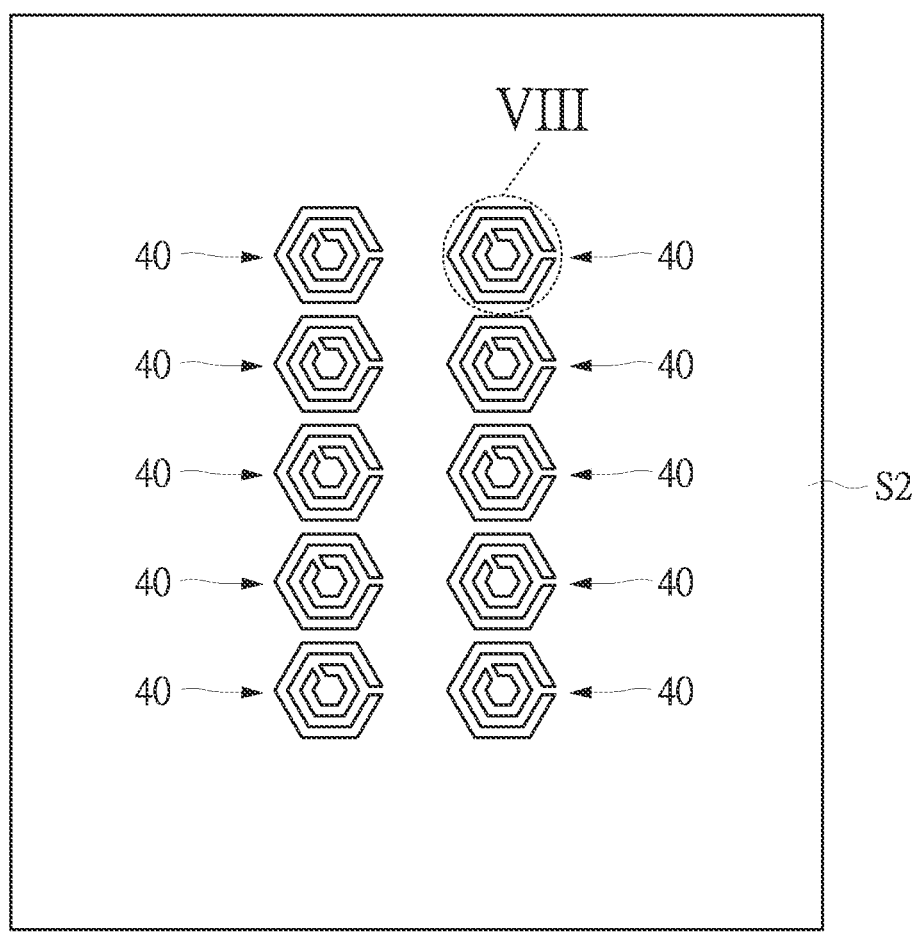
FIG. 7 is a schematic bottom view of a radio frequency circuit according to a fifth embodiment of the present disclosure.
Figure 8:
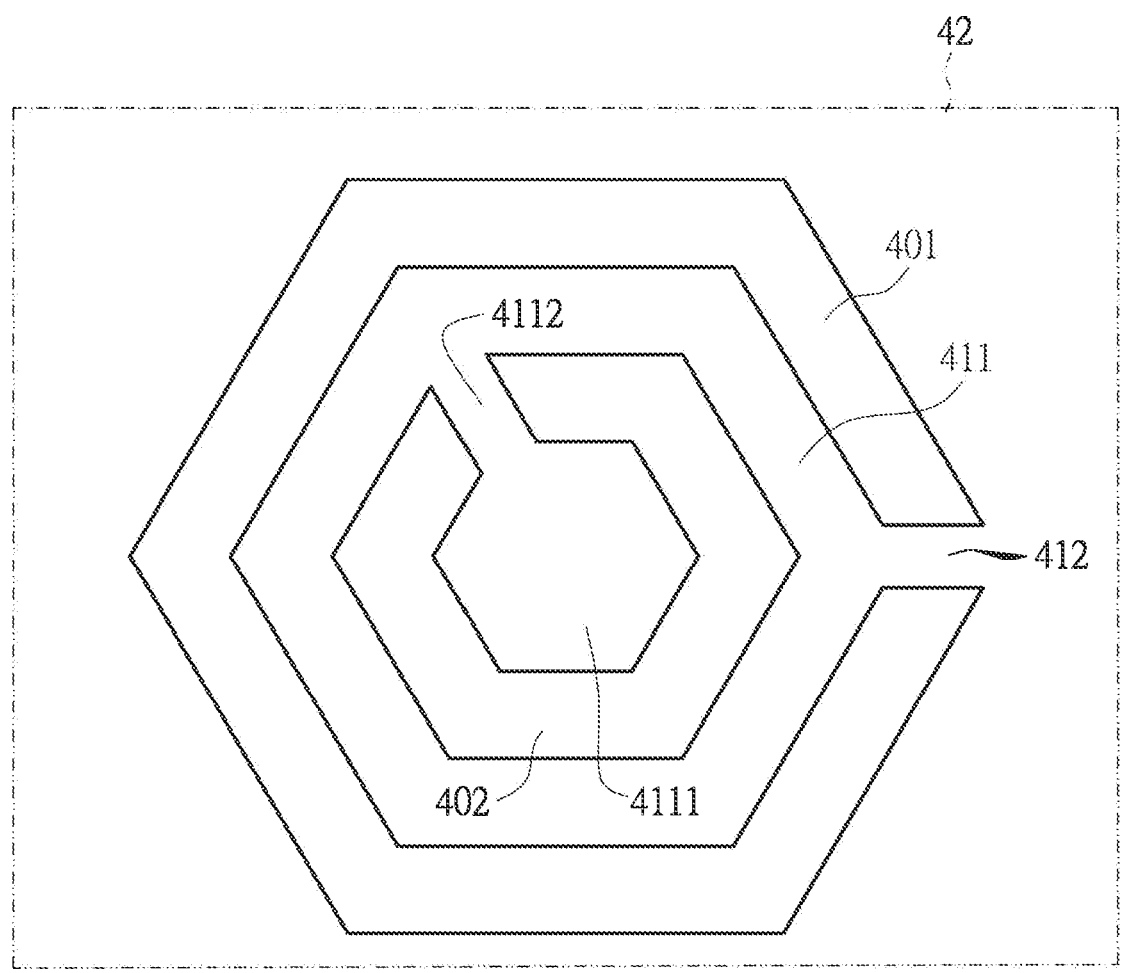
FIG. 8 is an enlarged view of part VIII of FIG. 7.

Referring to FIG. 2, FIG. 3, FIG. 7, and FIG. 8, FIG. 7 is a schematic bottom view of the radio frequency circuit according to the fifth embodiment of the present disclosure, and FIG. 8 is an enlarged view of part VIII of FIG. 7. In the fifth embodiment, a configuration pattern of the radio frequency circuit F on a front side (i.e., the first surface S1 of the substrate S) is shown in FIG. 3, and a configuration pattern of the radio frequency circuit F on a back side (i.e., the second surface S2 of the substrate S) is shown in FIG. 7. The metal layer 4 on the second surface S2 of the substrate S has a plurality of slot structures 40, which are arranged linearly, formed thereon, and each of the plurality of slot structures 40 has a first annular slot 401. Specifically, as shown in FIG. 8, the metal layer 4 has a plurality of first parts 41 and a second part 42, and each of the plurality of first parts 41 and the second part 42 are separated from each other by the first annular slot 401. One part of the metal layer 4 that is surrounded by the first annular slot 401 is the first part 41, and another part of the metal layer 4 that is not surrounded by the first annular slot 401 is the second part 42. Further, multiple ones of the first annular slots 401 respectively surround the plurality of the first parts 41, and each of the plurality of first parts 41 has a first conductive part 411 and a first connection part 412 formed therein. The first conductive part 411 is arranged in an area that is surrounded by a corresponding one of the first annular slots 401, and the first connection part 412 is connected between the first conductive part 411 and the second part 42. In addition, each of the first conductive parts 411 has a second annular slot 402 formed therein. The second annular slot 402 surrounds a part of the first conductive part 411, a second conductive part 4111 and a second connection part 4112 are formed within the part of the first conductive part 411, and the second connection part 4112 is connected between the first conductive part 411 and the second conductive part 4111.

Figure 12:
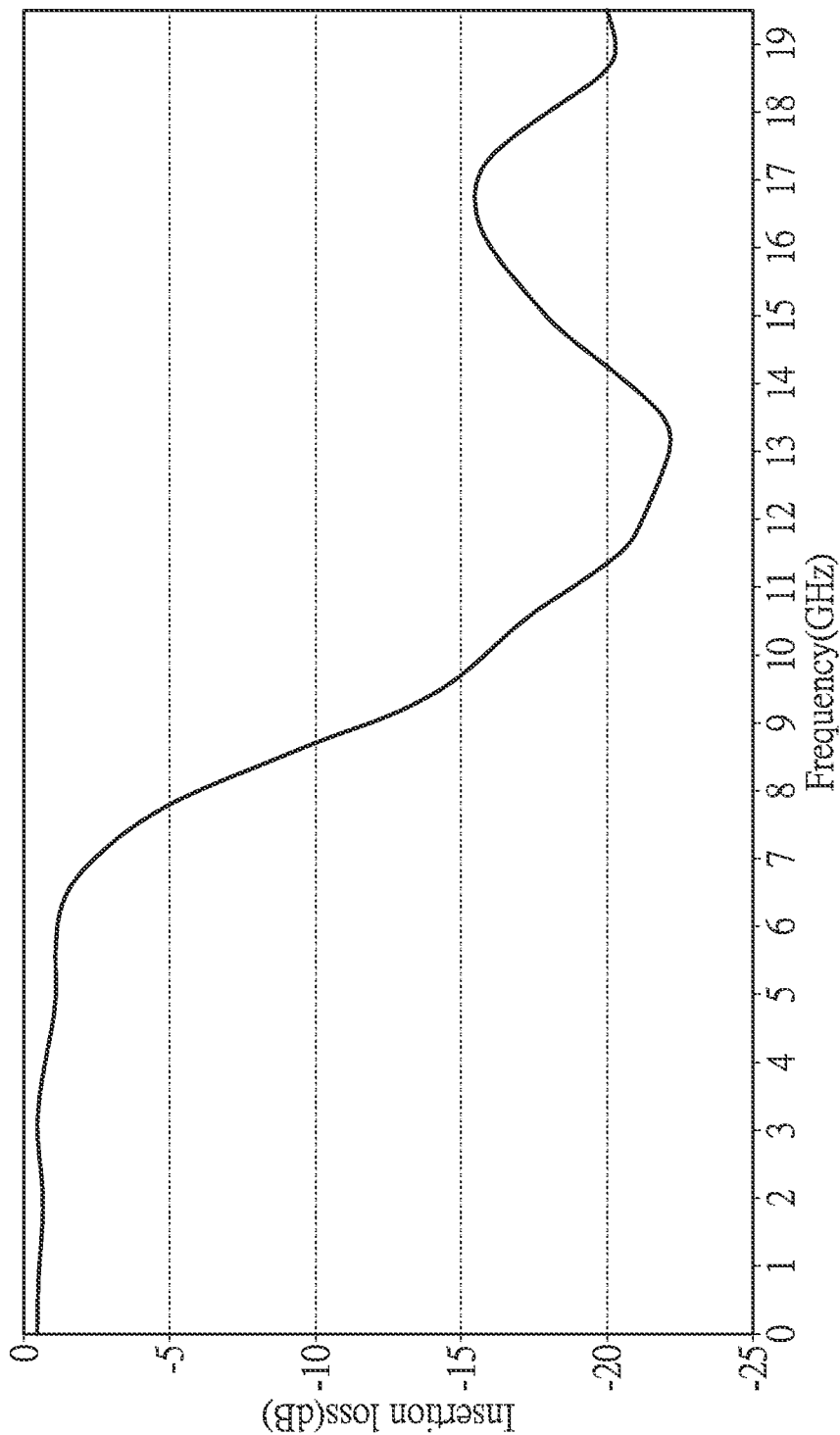
FIG. 12 is a curve diagram showing insertion losses of the radio frequency circuit according to the fifth embodiment of the present disclosure.
Figure 13:
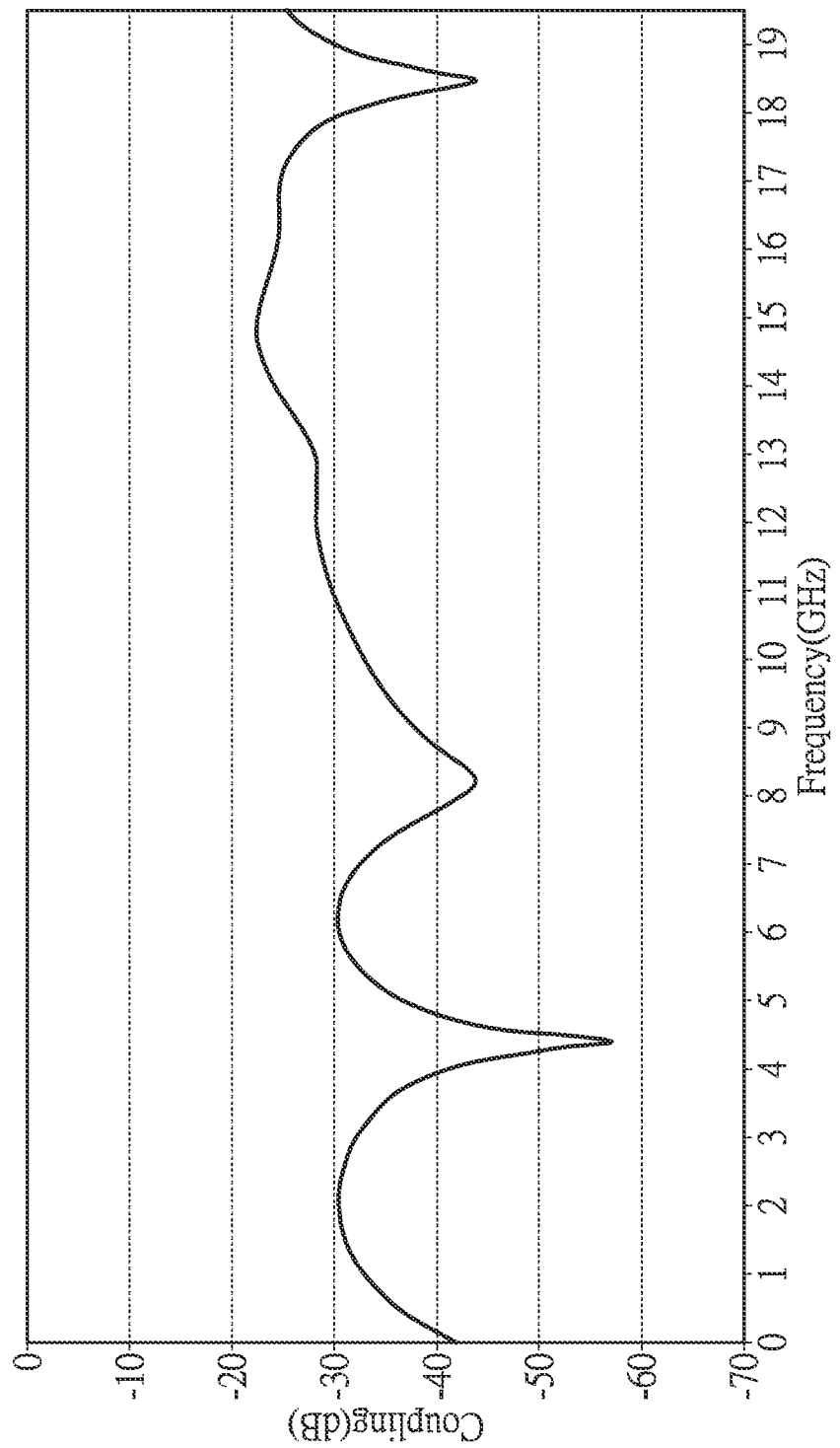
FIG. 13 is a curve diagram showing coupling of the radio frequency circuit according to the fifth embodiment of the present disclosure.

According to the above, multiple ones of the first annular slots 401 and multiple ones of the second annular slots 402 have a third equivalent capacitor, multiple ones of the first conductive parts 411 and multiple ones of the second conductive parts 4111 have a third equivalent inductor, and a resonant circuit can be formed by the third equivalent capacitor and the third equivalent inductor. A capacitance value of the third equivalent capacitor is proportional to a sum of areas of multiple ones of the first annular slots 401 and areas of multiple ones of the second annular slots 402. An inductance value of the third equivalent inductor is proportional to a sum of areas of multiple ones of the first conductive parts 411 and areas of multiple ones of the second conductive parts 4111. Referring to FIG. 12 and FIG. 13, FIG. 12 is a curve diagram showing insertion losses of the radio frequency circuit according to the fifth embodiment of the present disclosure, and FIG. 13 is a curve diagram showing coupling of the radio frequency circuit according to the fifth embodiment of the present disclosure. More precisely, FIG. 12 and FIG. 13 are characteristic curve diagrams of the radio frequency circuit of the present disclosure having the slot structures 40 formed on the metal layer 4 on the back side thereof. Comparing FIG. 12 and FIG. 13 respectively with FIG. 10 and FIG. 11, when the slot structures 40 are formed on the metal layer 4 on the back side of the radio frequency circuit F, the resonant circuit formed by the third equivalent capacitor and the third equivalent inductor generated through the slot structures 40 can further increase a high-frequency filtering effect in a high-frequency range (compared with the insertion loss of less than −10 dB between 15 GHz and 18 GHz shown in FIG. 10, the insertion loss between 15 GHz and 18 GHz shown in FIG. 12 can be further reduced to be less than −15 dB) without affecting an original coupling effect.

In addition, it is worth mentioning that, in the embodiments of the present disclosure, each of the first annular slot 401 and the second annular slot 402 is formed along a hexagonal profile, so that each of the first conductive part 411 and the second conductive part 4111 are hexagonal-shaped, but the present disclosure is not limited to a shape of the slot structure 40. In other embodiments, each of the first annular slot 401 and the second annular slot 402 can also be formed along a quadrilateral profile, a circular profile, or profiles of other shapes. Moreover, the present disclosure is not limited to a quantity of the annular slots. In the embodiments of the present disclosure, each of the slot structures 40 has two annular slots (i.e., the first annular slot 401 and the second annular slot 402). In other embodiments, the quantity of the annular slots can be one, or three or more.

Figure 9:
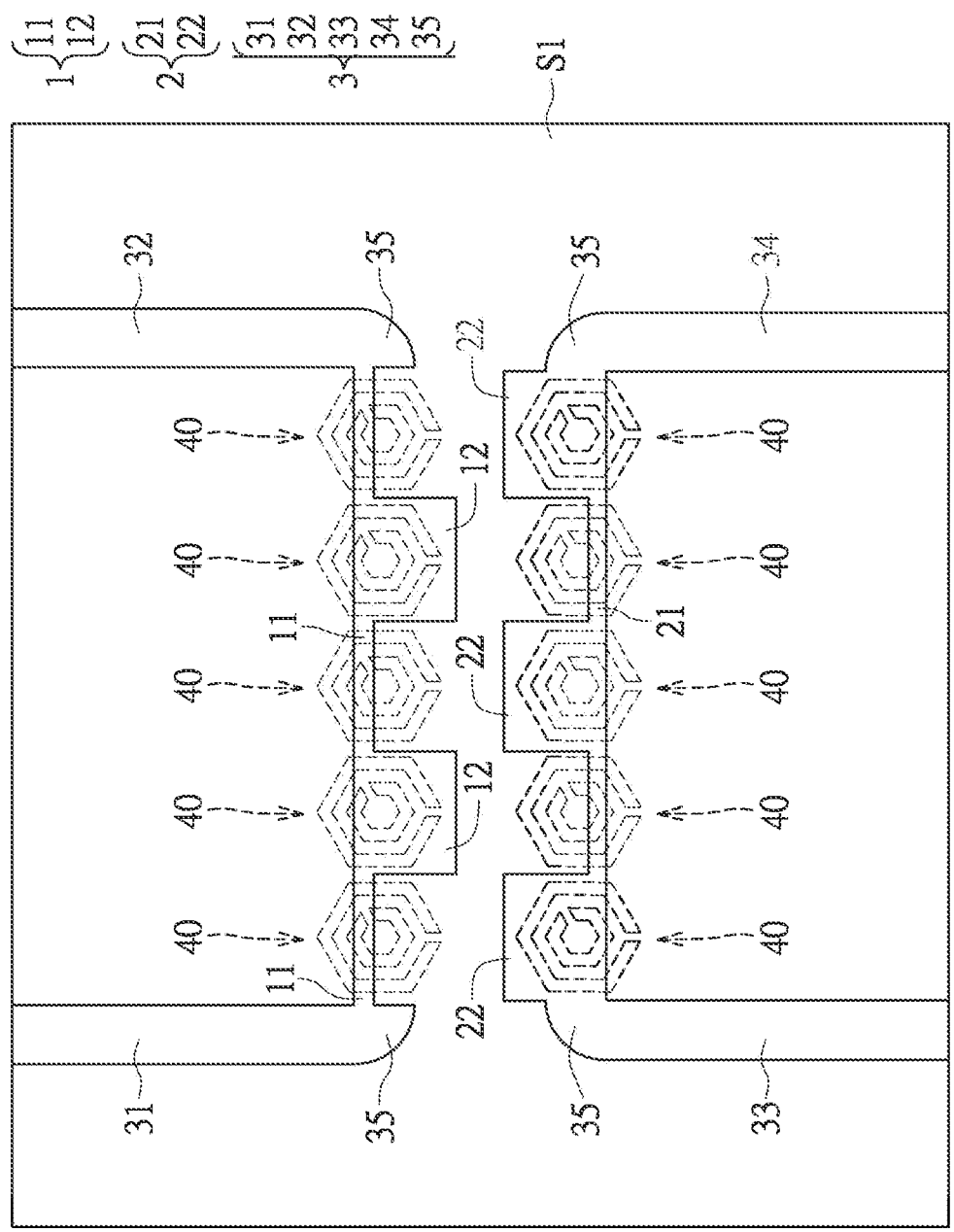
FIG. 9 is a schematic top perspective view of the radio frequency member according to the fifth embodiment of the present disclosure.

Referring to FIG. 9, FIG. 9 is a schematic top perspective view of the radio frequency according to the fifth embodiment of the present disclosure. In the present embodiment, projections of multiple ones of the first annular slots 401 and multiple ones of the second annular slots 402 onto the substrate S are correspondingly close to (preferably overlapping) projections of the first branches 11 and the second branches 12 of the first conducting wire 1 onto the substrate S and projections of the third branches 21 and the fourth branches 22 of the second conducting wire 2 onto the substrate S. In this way, in the present disclosure, a high-frequency filtering effect generated by the resonant circuit formed by the third equivalent capacitor and the third equivalent inductor can be improved through having the projections of multiple ones of the first annular slots 401 and multiple ones of the second slots 402 on the substrate S be as close as possible to the first branches 11, the second branches 12, the third branches 21, and the fourth branches 22, correspondingly.

Beneficial Effects of the Embodiments

In conclusion, one of the beneficial effects of the present disclosure is that, in the communication device W and the radio frequency circuit F provided by the present disclosure, by virtue of "the first conducting wire 1 and the second conducting wire 2 being separate from each other and coupled to each other, and each of the width of the first conducting wire 1 and the width of the second conducting wire 2 being not equal to the width of any one of the four transmission lines 3," each of the first conducting wire 1 and the second conducting wire 2 has characteristics of both capacitance and inductance (i.e., the first equivalent capacitor, the first equivalent inductor, the second equivalent capacitor, and the second equivalent inductor), so that the radio frequency circuit F provided by the present disclosure can have both coupling and filtering effects.

Furthermore, in the radio frequency circuit F provided by the present disclosure, the resonant circuit formed by the third equivalent capacitor and the third equivalent inductor generated through the slot structures 40 can increase the high-frequency filtering effect in the high-frequency range without affecting the original coupling effect. In addition, in the present disclosure, the high-frequency filtering effect generated by the resonant circuit formed by the third equivalent capacitor and the third equivalent inductor can also be improved through having the projections of multiple ones of the first annular slots 401 and multiple ones of the second slots 402 on the substrate S be as close as possible to the first branches 11, the second branches 12, the third branches 21, and the fourth branches 22, correspondingly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A communication device for operating in an operating frequency band, the communication device comprising:
   an antenna element;
   a transceiver electrically connected to the antenna element, the transceiver having a transmitting end and a feedback receiving end; and
   a radio frequency circuit electrically connected between the antenna element and the transceiver, the radio frequency circuit including:
      a substrate;
      a first conducting wire disposed on a first surface of the substrate;
      a second conducting wire disposed on the first surface and arranged corresponding to the first conducting wire; and
      four transmission lines disposed on the first surface, wherein two of the four transmission lines are respectively connected to two ends of the first conducting wire to form an input part and an output part, and another two of the four transmission lines are respectively connected to two ends of the second conducting wire to form a coupling part and an isolation part; wherein the input part is arranged corresponding to the coupling part, and the output part is arranged corresponding to the isolation part;

wherein the input part is electrically connected to the transmitting end, the output part is electrically connected to the antenna element, the coupling part is electrically connected to the feedback receiving end, and the isolation part is connected to a ground potential;

wherein the first conducting wire and the second conducting wire are separate from each other and coupling to each other, and each of a width of the first conducting wire and a width of the second conducting wire is not equal to a width of any one of the four transmission lines.

2. The communication device according to claim 1, wherein each of the four transmission lines has an adaption part at one end of each of the four transmission lines that is connected to the first conducting wire or the second conducting wire, and an edge profile of the adaption part is a quarter arc having a radius defined by the width of the transmission line.

3. The communication device according to claim 1, wherein the first conducting wire has at least one first branch and at least one second branch that are staggered with each other, and the second conducting wire has at least one third branch and at least one fourth branch that are staggered with each other; wherein each of a width of the at least one first branch and a width of the at least one third branch is less than the width of any one of the four transmission lines, and each of a width of the at least one second branch and a width of the at least one fourth branch is greater than the width of any one of the four transmission lines.

4. The communication device according to claim 3, wherein, when the first conducting wire is arranged corresponding to the second conducting wire, the at least one first branch of the first conducting wire corresponds to the at least one fourth branch of the second conducting wire, and the at least one second branch of the first conducting wire corresponds to the at least one third branch of the second conducting wire.

5. The communication device according to claim 4, wherein a first edge is defined by an extension of a side of the at least one second branch of the first conducting wire, a second edge is defined by an extension of a side of the at least one fourth branch of the second conducting wire, and the first edge and the second edge coincide with each other.

6. The communication device according to claim 4, wherein a first edge is defined by an extension of a side of the at least one second branch of the first conducting wire, a second edge is defined by an extension of a side of the at least one fourth branch of the second conducting wire, a distance between the first edge and the at least one third branch is less than the width of the at least one fourth branch, and a distance between the second edge and the at least one first branch is less than the width of the at least one second branch.

7. The communication device according to claim 3, wherein the operating frequency band has a minimum operating frequency, and a first wavelength is obtained according to an initial wavelength of the minimum operating frequency in vacuum and a dielectric coefficient of the substrate; wherein a first edge is defined by an extension of a side of the at least one second branch of the first conducting wire, a second edge is defined by an extension of a side of the at least one fourth branch of the second conducting wire, there is a distance between the first edge and the second edge, and the distance is between 1/200 times and 1/4 times of the first wavelength.

8. The communication device according to claim 3, wherein, when the first conducting wire is arranged corresponding to the second conducting wire, the at least one first branch corresponds to the at least one third branch, and the at least one second branch corresponds to the at least one fourth branch.

9. The communication device according to claim 3, wherein the radio frequency circuit further includes a metal layer disposed on a second surface of the substrate, and the second surface is opposite to the first surface; wherein the metal layer has a plurality of first annular slots that are arranged linearly thereon, projections of the plurality of the first annular slots onto the substrate are close to or overlap with a projection of the at least one first branch, a projection of the at least one second branch, a projection of the at least one third branch, and a projection of the at least one fourth branch onto the substrate.

10. The communication device according to claim 9, wherein the metal layer has a plurality of first parts and a second part, and the plurality of first annular slots respectively surround the plurality of first parts; wherein each of the plurality of first parts has one of a plurality of first conductive parts and a first connection part formed therein, the first conductive part is arranged in an area that is surrounded by a corresponding one of the plurality of first annular slots, and the first connection part is connected between the one of the first conductive parts and the second part.

11. The communication device according to claim 10, wherein each of the plurality of first conductive parts has a second annular slot formed therein, and the second annular slot surrounds a part of the one of the first conductive parts; wherein a second conductive part and a second connection part are formed within the part of the one of the first conductive parts, and the second connection part is connected between the first conductive part and the second conductive part.

12. A radio frequency circuit, comprising:
a substrate;
a first conducting wire disposed on a first surface of the substrate;
a second conducting wire disposed on the first surface and arranged corresponding to the first conducting wire; and
four transmission lines, wherein two of the four transmission lines are respectively connected to two ends of the first conducting wire to form an input part and an output part, and another two of the four transmission lines are respectively connected to two ends of the second conducting wire to form a coupling part and an isolation part, wherein the input part is arranged corresponding to the coupling part, the output part is arranged corresponding to the isolation part, and the isolation part is connected to a ground potential;
wherein the first conducting wire and the second conducting wire are separate from each other and coupling to each other, and each of a width of the first conducting wire and a width of the second conducting wire is not equal to a width of any one of the four transmission lines.

13. The radio frequency circuit according to claim 12, wherein each of the four transmission lines has an adaption part at one end of each of the four transmission lines that is connected to the first conducting wire or the second conducting wire, and an edge profile of the adaption part is a quarter arc having a radius defined by the width of the transmission line.

14. The radio frequency circuit according to claim 12, wherein the first conducting wire has at least one first branch and at least one second branch that are staggered with each other, and the second conducting wire has at least one third branch and at least one fourth branch that are staggered with each other; wherein each of a width of the at least one first branch and a width of the at least one third branch is less than the width of any one of the four transmission lines, and each of a width of the at least one second branch and a width of the at least one fourth branch is greater than the width of any one of the four transmission lines.

15. The radio frequency circuit according to claim 14, further comprising:
 a metal layer disposed on a second surface of the substrate, the second surface being opposite to the first surface;
 wherein the metal layer has a plurality of first annular slots that are arranged linearly thereon, projections of the plurality of the first annular slots onto the substrate are close to or overlap with a projection of the at least one first branch, a projection of the at least one second branch, a projection of the at least one third branch, and a projection of the at least one fourth branch onto the substrate.

16. The radio frequency circuit according to claim 15, wherein the metal layer has a plurality of first parts and a second part, and the plurality of first annular slots respectively surround the plurality of first parts; wherein each of the plurality of first parts has a first conductive part and a first connection part formed therein, the first conductive part is arranged in an area that is surrounded by a corresponding one of the plurality of first annular slots, and the first connection part is connected between the first conductive part and the second part.

* * * * *